(12) United States Patent
Kim et al.

(10) Patent No.: US 10,282,001 B2
(45) Date of Patent: May 7, 2019

(54) CONDUCTIVE FILM AND TOUCH PANEL INCLUDING THE SAME

(71) Applicant: LG ELECTRONICS INC., Seoul (KR)

(72) Inventors: Yuhee Kim, Seoul (KR); Yangwook Hur, Seoul (KR); Jinyoung Choi, Seoul (KR); Munsu Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 56 days.

(21) Appl. No.: 15/247,415

(22) Filed: Aug. 25, 2016

(65) Prior Publication Data

US 2017/0003773 A1    Jan. 5, 2017

Related U.S. Application Data

(63) Continuation of application No. 14/309,481, filed on Jun. 19, 2014, now Pat. No. 9,459,741.

(30) Foreign Application Priority Data

| Jun. 20, 2013 | (KR) | 10-2013-0071082 |
| Jul. 15, 2013 | (KR) | 10-2013-0083023 |

(51) Int. Cl.
| H05K 1/09 | (2006.01) |
| G06F 3/041 | (2006.01) |
| G06F 3/044 | (2006.01) |

(52) U.S. Cl.
CPC .............. *G06F 3/041* (2013.01); *G06F 3/044* (2013.01); *H05K 1/097* (2013.01); *G06F 2203/04103* (2013.01); *G06F 2203/04112* (2013.01); *H05K 2201/026* (2013.01)

(58) Field of Classification Search
CPC ...................................................... G06F 3/041
USPC .......................................................... 345/173
See application file for complete search history.

(56) References Cited

U.S. PATENT DOCUMENTS

| 2005/0221054 A1 | 10/2005 | Kawano et al. |
| 2009/0228131 A1 | 9/2009 | Wolk et al. |
| 2011/0260741 A1 | 10/2011 | Weaver et al. |
| 2011/0285019 A1 | 11/2011 | Alden et al. |
| 2012/0024572 A1 | 2/2012 | Naoi et al. |
| 2012/0098419 A1 | 4/2012 | Chiba et al. |
| 2012/0150780 A1* | 6/2012 | Nugent .................. G06N 3/063 706/33 |

(Continued)

FOREIGN PATENT DOCUMENTS

| CN | 1643405 | 7/2005 |
| CN | 101292362 | 6/2011 |

(Continued)

OTHER PUBLICATIONS

Extended European Search Report for Application EP 14 81 2909 dated Jan. 18, 2017.

(Continued)

*Primary Examiner* — Stanley Tso
(74) *Attorney, Agent, or Firm* — KED & Associates, LLP

(57) ABSTRACT

A conductive film may be provided that includes a base member, a first hard coating layer formed on a surface of the base member, and a conductive layer formed on the first hard coating layer. The conductive layer may include conductors composed of a nano-material forming a network structure.

16 Claims, 14 Drawing Sheets

(56) References Cited

U.S. PATENT DOCUMENTS

| | | | |
|---|---|---|---|
| 2013/0034760 A1* | 2/2013 | Otts | H01M 4/668 |
| | | | 429/94 |
| 2013/0056244 A1 | 3/2013 | Srinivas et al. | |
| 2013/0251979 A1 | 9/2013 | Saitou et al. | |
| 2013/0342221 A1* | 12/2013 | Virkar | G06F 3/041 |
| | | | 324/661 |
| 2014/0093743 A1 | 4/2014 | Arai et al. | |
| 2014/0299365 A1 | 10/2014 | Sebastian et al. | |
| 2014/0305682 A1 | 10/2014 | Sato et al. | |
| 2014/0370631 A1* | 12/2014 | Thompson | H01L 33/005 |
| | | | 438/34 |
| 2015/0002760 A1* | 1/2015 | Morimoto | G02F 1/13338 |
| | | | 349/12 |
| 2015/0027755 A1 | 1/2015 | Tsujimoto et al. | |
| 2015/0038033 A1* | 2/2015 | Gaynor | H01B 1/22 |
| | | | 442/52 |
| 2015/0064401 A1 | 3/2015 | Honda | |
| 2015/0116234 A1 | 4/2015 | Nasu et al. | |
| 2015/0321220 A1* | 11/2015 | Mishima | B22F 7/04 |
| | | | 428/292.1 |

FOREIGN PATENT DOCUMENTS

| | | | |
|---|---|---|---|
| JP | 2013-008512 | | 1/2013 |
| JP | 2013-8512 A | | 1/2013 |
| KR | 10-2011-0001924 A | | 1/2011 |
| KR | 10-2012-0098823 A | | 9/2012 |
| KR | 10-2012-017762 A | | 10/2012 |
| KR | 10-2012-0113507 | | 10/2012 |
| KR | 10-2012-0113507 A | | 10/2012 |
| KR | 10-2012-0117762 | | 10/2012 |
| KR | 10-1212372 B1 | | 12/2012 |
| KR | 10-2013-0028079 A | | 3/2013 |
| KR | 2013-0028079 | | 3/2013 |
| TW | 2011-26542 A | | 8/2011 |
| TW | 201200467 | | 1/2012 |
| TW | 2012-44947 A | | 11/2012 |
| WO | PCT/JP2012/052771 | * 2/2012 | H05B 33/02 |
| WO | WO 2012/137883 | | 10/2012 |

OTHER PUBLICATIONS

PCT International Search Report dated Sep. 19, 2014 issued in Application No. PCT/KR2014/005367.
Korean Office Action dated Oct. 30, 2013 issued in Application No. 10-2013-0071082.
Korean Office Action dated Apr. 20, 2014 issued in Application No. 10-2008-0124850.
Korean Notice of Allowance dated Jan. 3, 2014 in Application No. 10-2013-0083023.
Taiwanese Office Action for Application 103121075 dated Nov. 2, 2015.
English language translation of Taiwanese Office Action.
U.S. Office Action dated Sep. 2, 2015 for U.S. Appl. No. 14/309,481.
U.S. Final Office Action dated Dec. 22, 2015 for U.S. Appl. No. 14/309,481.
Chinese Office Action issued in Application 201480035370.7 dated Sep. 2, 2016 (full Chinese text and full English translation).
Taiwan Office Action dated Sep. 19, 2017 issued in Application No. 105123629.

* cited by examiner (a)                                (b)

(a)                  (b)

(a)                                (b)

CONDUCTIVE FILM AND TOUCH PANEL INCLUDING THE SAME

CROSS-REFERENCE TO RELATED APPLICATIONS

This application is a Continuation Application of U.S. patent application Ser. No. 14/309,481 filed on Jun. 19, 2014, which claims the benefit of Korean Patent Applications Nos. 2013-0071082 and 2013-0083023 filed on Jun. 20, 2013 and Jul. 15, 2013, respectively, the subject matters of which are incorporated herein by reference.

BACKGROUND

1. Field

Embodiments may relate to a conductive film and a touch panel including a conductive film.

2. Background

A portable terminal may have one or more of voice and video calling function, information input and output function and data storage memory function. A portable terminal may have complicated functions such as photographing of images or videos, playing of music files or video files, games, broadcasting and wireless internet and may be implemented as a general multimedia player.

The portable terminal may wirelessly access the Internet, thus enabling web surfing, talk with friends or colleagues via access to a messenger, transmission of e-mails and checking of received e-mails.

A conductive film (including a transparent conductive thin film) may be diversely applied to a variety of electronic devices, such as displays and touch panels. The conductive film may be provided by forming a transparent conductive thin film that is transparent and having a low resistance on a plastic substrate and patterning the transparent conductive thin film.

The transparent conductive thin film may be formed by vacuum-depositing a material, such as indium-tin oxide (ITO). However, the material (such as indium-tin oxide) may be expensive and the method of vacuum deposition does not have high production efficiency. Additionally, there may be a limit in improving properties of an electronic device including indium-tin oxide because the indium-tin oxide is not flexible and may have a high resistance.

SUMMARY

Embodiments may provide a conductive film applicable to a wide area due to superior properties thereof and a touch panel including the same.

Embodiments may provide a conductive film that includes a base member, a first hard coating layer formed on a surface of the base member, and a conductive layer formed on the first hard coating layer. The conductive layer may include conductors composed of a nano-material forming a network structure.

Embodiments may provide a touch panel that includes a cover substrate, a first transparent adhesion layer disposed on the cover substrate, and a first conductive film disposed on the transparent adhesion layer. The first conductive film may include a base member, a first hard coating layer formed on a surface of the base member, and a first conductive layer formed on the first hard coating layer. The first conductive layer may include a plurality of conductors composed of a nano-material forming a network structure.

Embodiments may provide a touch panel that includes a first conductive layer constituting a first electrode, and a second conductive layer constituting a second electrode that is different from the first electrode. The first conductive layer may include a plurality of conductors composed of a nano-material forming a network structure. A conductive region (or conductive area) of the first conductive layer may include a conductive portion in which the conductors are disposed and a non-conductive portion (or non-conductive area) in which the conductors are not disposed, when the first conductive layer is seen in plan view.

The conductive film may include the first hard coating layer formed between the conductive layer (including conductors of nano-materials having a network structure) and the base member. As a result, hardness of the conductive film may be improved, thereby preventing damage of the conductive layer or change of properties thereof during a process. Additionally, the surface on which the conductive layer is formed may be planarized, thereby improving coating properties of the conductive layer and reducing scattered reflection.

The touch panel may include the conductive layer including a plurality of conductors composed of a nano-material having a network structure. As a result, the conductive layer may include a non-conductive portion, thereby improving transmittance, reducing cost due to decrease in amount of raw materials used for the conductors and obtaining low resistance due to superior electrical properties of the conductors. Accordingly, the touch panel may include the conductive layer, which has a lower resistance and a smaller thickness than other portions touch panel, and thus may be implemented in a wider area and exhibit superior optical properties and/or the like.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
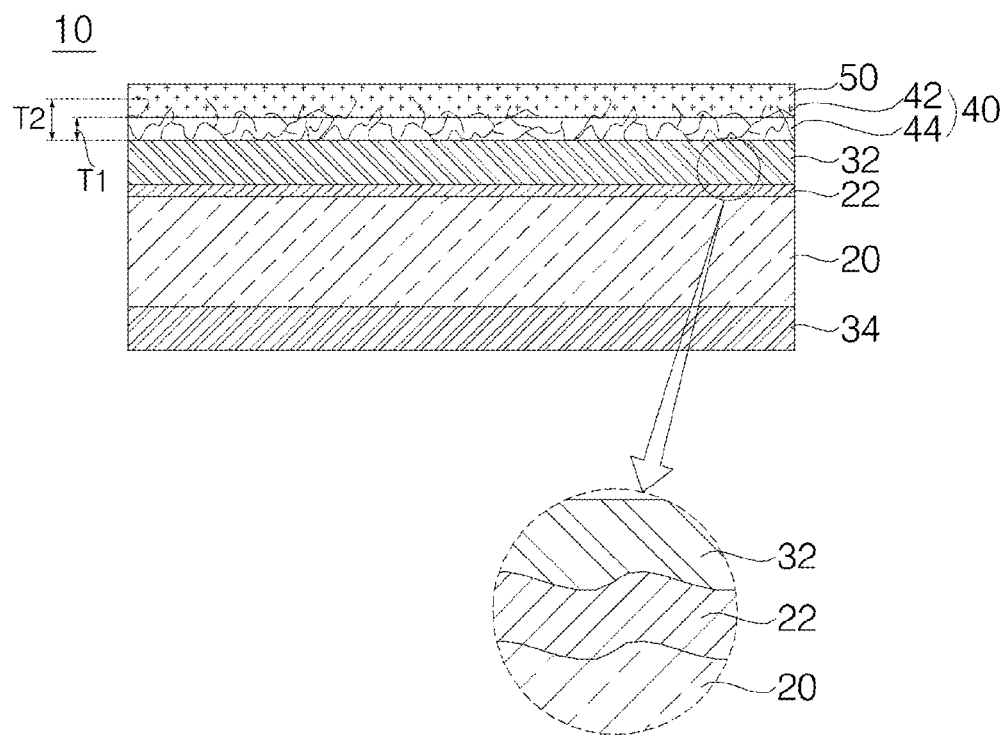
FIG. 1 is a sectional view illustrating a conductive film according to an example embodiment.

Reference may be made in detail to the preferred embodiments, examples of which are illustrated in the accompanying drawings. Embodiments are not limited to the disclosed embodiments and embodiments may be modified into various forms.

In the drawings, parts unrelated to the description may not be illustrated for clear and brief description, and same reference numbers may be used throughout the specification to refer to the same or considerably similar parts. In the drawings, thickness or size may be exaggerated or reduced for more clear description. In addition, the size or area of each constituent element may not be limited to that illustrated in the drawings.

It will be further understood that, throughout this specification, when one element is referred to as "comprising" another element, the term "comprising" specifies the presence of another element but does not preclude the presence of other additional elements, unless context clearly indicates otherwise. Additionally, it may be understood that when one element such as a layer, a film, a region or a plate is referred to as being "on" another element, the one element may be directly on the other element or one or more intervening elements may be present. In contrast, when one element such as a layer, a film, a region or a plate is referred to as being "directly on" another element, one or more intervening elements are not present.

A conductive film according to an example embodiment may be described with reference to the annexed drawings.

FIG. 1 is a sectional view illustrating a conductive film according to an example embodiment. Other embodiments and configurations may also be provided.

As shown in FIG. 1, a conductive film 10 may include a base member 20, a first hard coating layer 32 formed on a first surface of the base member 20 (i.e., an upper surface in the drawing), and a conductive layer 40 formed on the first hard coating layer 32. The conductive layer 40 may include a plurality of conductors 42 made of a nano-material having a network structure. The conductive film 10 may further include a second hard coating layer 34 formed on a surface of the base member 20 (i.e., a lower surface in the drawing), a primer layer 22 formed between the base member 20 and the first hard coating layer 22, and an over-coating layer 50 formed on the conductive layer 40.

The base member 20 may be a film, sheet, substrate and/or the like that is composed of a material for maintaining mechanical strength of the conductive film 10 and having transmittance. The base member 20 may include at least one of polyethylene, polypropylene, polyethylene terephthalate, polyethylene-2,6-naphthalate, polypropylene terephthalate, polyimide, polyamideimide, polyethersulfone, polyetheretherketone, polycarbonate, polyarylate, cellulose propionate, polyvinyl chloride, polyvinylidene chloride, polyvinylalcohol, polyetherimide, polyphenylene sulfide, polyphenylene oxide, polystyrene and/or the like. For example, the base member 20 may include polyethylene terephthalate, although embodiments are not limited thereto. The base member 20 may include a variety of materials, in addition to the material described above.

The base member 20 may have a thickness for enabling the conductive film 10 to maintain mechanical strength. For sufficient mechanical strength, the base member 20 may have a greater thickness than other layers (i.e., the primer layer 22, the first and second over-coating layers 32 and 34, the conductive layer 40 and the over-coating layer 50). As one example, the base member 20 may have a thickness of 50 μm to 300 μm. When the thickness of the base member 20 is less than 50 μm, the mechanical strength may be not sufficient, and when the thickness exceeds 300 μm, the cost associated with the materials increases and thinness may be difficult. When taking into consideration mechanical strength and thinness, the thickness of the base member 20 may be 50 μm to 200 μm. However, embodiments are not limited thereto and the thickness of the base member 20 may be changed.

The base member 20 may be produced by solution casting, film extrusion and/or the like, and the base member 20 may be annealed at a glass transition temperature of the film for several seconds to several minutes in order to minimize deformation caused by temperature after production of the base member 20. After annealing, the base member 20 may be surface-treated by a method such as plasma treatment using argon, oxygen, nitrogen or carbon dioxide or UV-ozone treatment, or ion beam treatment using a reactive gas, in order to improve coatability and adhesivity. However, embodiments are not limited thereto, and the base member 20 may be produced by a variety of methods.

The primer layer 22 may be formed on a surface (i.e., an upper surface of the drawing) of the base member 20. The primer layer 22 may be formed on the base member 20 to improve coatability and adhesivity. The primer layer 22 may include a curable resin. Any of a number of resins may be used as the curable resin without particular limitation so long as it is a resin cured upon application of energy such as heat, UV irradiation or electron beam irradiation. For example, the curable resin may be a silicone resin, an acrylic resin, a methacrylic resin, an epoxy resin, a melamine resin, a polyester resin, a urethane resin and/or the like, although embodiments are not limited thereto. In addition to materials suggested as examples of the curable resin, a variety of substances may be used.

The primer layer 22 may have a relatively small thickness because it is applied in order to improve coatability and adhesivity. That is, the primer layer 22 may have a thickness less than the base member 20 and the first and second hard coating layers 32 and 34. For example, the thickness of the primer layer 22 may be 50 nm to 200 nm. The thickness of the primer layer 22 may be determined to be within a range such that the primer layer 22 covers an entire surface of the base member 20 to a uniform thickness and thus an unnecessary increase in thickness may be prevented.

The first hard coating layer 32 may be provided on the primer layer 22 formed on the upper surface of the base member 20. In this embodiment, various properties of the conductive film 10 having the conductive layer 40 provided with the conductors 42 (composed of a nano-material having a network structure) can be improved by providing the first hard coating layer 32 between the base member 20 and the conductive layer 40.

The conductive layer 40 formed on the primer layer 22 may be provided with the conductors 42 having conductivity. The conductors 42 may be a nano-material including a metal and constituting the network structure (or a mesh structure, cobweb structure). That is, the conductors 42 of nano-material (for example, nanowires) are tangled to each other so that the conductors 42 have the contact points between the conductors 42 adjacent to each other. Then, the conductors 42 are in contact with each other only at the contact points of the plurality of conductors 42. Thus, the plurality of conductors 42 has a structure such as the network structure, the mesh structure, or the cobweb structure. The electricity can efficiently flow between the plurality of conductors 42 via the contact points of the plurality of conductors 42. For example, the conductors 42 (included in the conductive layer 40) may be nanowires. The nanowires may be produced in the form of a wire through anisotropic growth. As used hereinafter, the term conductive layer 40 may refer to a layer having a uniform thickness or a layer having voids between the conductors 42 forming a network structure. The conductive layer 40 may be provided by applying a mixture of a nano-material and an extremely small amount of solvent, binder and/or the like. As a result, a residual portion 44 formed by residues of the solvent, the binder and/or the like may be formed to have a relatively small first thickness T1, and the conductors 42 may extend to outside of the residual portion 44 and may be formed to have a relatively larger second thickness T2.

The conductive layer 40 (including the nanowires as the conductors 42) may be formed by wet-coating, which may entail a lower production cost than a deposition method and may have a considerably low metal concentration (e.g., 1% or less). Accordingly, costs for formation of the conductive layer 40 may be reduced and production efficiency may thus be improved. Additionally, the conductive layer 40 may have the property of transmitting light and may thus be applied to various electronic devices requiring materials having light transmittance and conductivity. The nanowires may be silver (Ag) nanowires, copper (Cu) nanowires, platinum (Pt) nanowires and/or the like.

For example, a surface of silver (Ag) nanoparticles may have various crystal planes, thus easily inducing anisotropic growth and enabling easy production of silver nanowires. Because silver nanowires may have a resistance of approximately 10 to approximately 400 $\Omega/m^2$, the conductive layer 40 may have a resistance of approximately 10 to 120 $\Omega/m^2$. Accordingly, the conductive layer 40 having a variety of resistances may be formed. The conductive layer 40 may have a much better electrical conductivity than indium tin oxide having a resistance of approximately 200 to approximately 400 $\Omega/m^2$. Additionally, silver nanowires have better transmittance (e.g. 90% or more) than indium tin oxide. Silver nanowires may also be flexible and are thus suitable for use in flexible devices and raw silver supply may be stable.

As such, raw material costs are reduced and various properties are improved using silver nanowires forming a network structure as the conductors 42 of the conductive layer 40.

As described above, the silver nanowires may have, for example, a radius of 10 to 60 nm and a long axis length of 10 to 200 μm. Within this range, the silver nanowires have a high aspect ratio (e.g. 1:300-1:20000), thus well forming a network structure and effectively shielding the conductive layer 40. However, the radius, the long axis and the aspect ratio of nanowires may change, and embodiments are not limited thereto.

The thickness (e.g. relatively larger second thickness T2) of the conductive layer 40 may be 50 nm to 200 nm. When the thickness of the conductive layer 40 is less than 50 nm, electrical conductivity may be poor, and when the thickness exceeds 200 nm, material costs increase and production efficiency is thus deteriorated. When taking into consideration electrical conductivity and production efficiency, the thickness of the conductive layer 40 may be 110 nm to 135 nm, for example. The thickness of the conductive layer 40 may be a thickness formed by the conductors 42 having the network structure.

The over-coating layer 50 provided on (or over) the primer layer 22 and the conductive layer 40 may physically protect the conductive film 10. The over-coating layer 50 may entirely cover the conductors 42 extending or protruding to outside of the residual portion 44 to prevent oxidation of the conductors 42. That is, a portion of the over-coating layer 50 may be impregnated in a void between the conductors 42 and may fill the void between the conductors 42 while another portion of the over-coating layer 50 may be formed on the conductors 42.

The over-coating layer 50 may be formed of a resin. For example, the over-coating layer 50 may be formed of an acrylic resin, although embodiments are not limited thereto, and the over-coating layer 50 may include other materials.

For example, a thickness of the over-coating layer 50 may be 50 nm to 200 nm. When the thickness of the over-coating layer 50 is less than 50 nm, an effect of preventing oxidization of the conductors 42 may be insufficient. When the thickness of the over-coating layer 50 exceeds 200 nm, the cost of materials increases and contact resistance increases, although embodiments are not limited thereto and the thickness of the over-coating layer 50 may change.

An example in which the residual portion 44 of the conductive layer 40 and the over-coating layer 50 are formed as different layers has been described above, although embodiments are not limited thereto.

Figure 3:
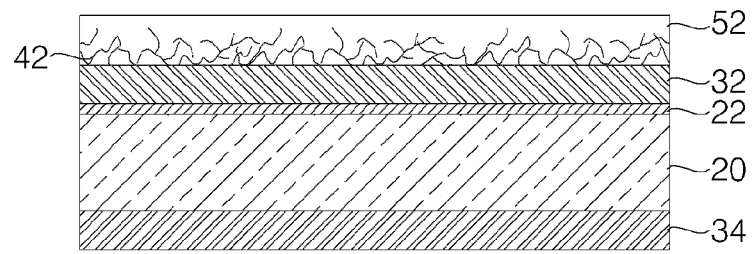
FIG. 3 is a sectional view illustrating a conductive film according to a modified example embodiment.

In another embodiment, FIG. 3 shows a configuration in which an over-coating layer 52 contacts the first hard coating layer 32 and the conductors 42 are provided in the over-coating layer 52, which is a single layer, may be implemented by coating an ink mixed with materials constituting the conductors 42 and the residual portion 44 of the conductive layer 40, and the over-coating layer 50. Other embodiments and configurations may also be provided.

The first hard coating layer 32 may be provided between the base member 20 and the conductive layer 40, and more specifically may be provided between the primer layer 22 and the conductive layer 40. As described above, because the conductors 42 are formed of a nano-material having a network structure, the conductive film 10 (or a structure forming the same) may be readily damaged by exterior force during operation for coating. That is, in the conductive film 10, because even small applied exterior force affects properties of contact between the nano-materials (e.g. nanowires)

forming the network structure, electrical conductivity of the conductive layer 40 may be changed. Accordingly, an overall hardness of the conductive film 10 may be improved by providing the first hard coating layer 32 having a relatively high hardness (i.e., having a hardness higher than the primer layer 22, the conductive layer 40 and the over-coating layer 50) between the base member 20 and the conductive layer 40. As a result, although exterior force is applied to the conductive film 10, excellent contact between the conductors 42 in the conductive layer 40 may be maintained.

Additionally, as shown in an enlarged circle of FIG. 1, the upper surface of the base member 20 may have a relatively high surface roughness and may be unevenly formed. As a result, an upper surface of the primer layer 22 having a relatively small thickness may also have a surface roughness comparable to the upper surface of the base member 20 and may be unevenly formed. The uneven surfaces of the base member 20 and the primer layer 22 may cause an increase in scattered reflection. In an example using the conductors 42 having the network structure, generation of scattered reflection may be serious due to network structure, haze (turbidity) increases and/or transmittance deteriorates. Additionally, when the conductive layer 40 is formed on the rough surfaces of the base member 20 and the primer layer 22, it may be difficult to form the conductive layer 40 (including nano-materials having a network structure) to a uniform thickness. As a result, a non-coated area may be generated and sheet resistance difference in the conductive layer 40 may increase.

Accordingly, the first hard coating layer 32 thicker than the primer layer 22 may be coated over the entire surface of the primer layer 22 to planarize the upper surface of the conductive film 10. That is, the upper surface of the first hard coating layer 32 may have a lower surface roughness than the lower surface of the first hard coating layer 32 present on the upper surface of the base member 20 and the primer layer 22. Planarization using the first hard coating layer 32 may minimize haze and scattered reflection and maximize transmittance. As a result, optical properties of the conductive film 10 may be improved. Additionally, coating properties of the conductive layer 40 may be enhanced. Accordingly, difference in various properties, such as sheet resistance and optical properties of the conductive layer 40, may be minimized.

Figure 2:
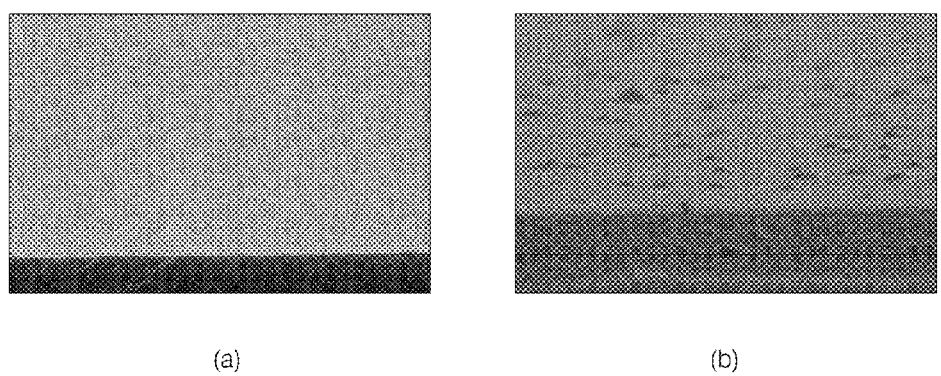
FIG. 2 shows surface planarization effect of a first hard coating layer included in the conductive film according to an example embodiment.

Referring to FIG. 2, surface planarization using the first hard coating layer 32 may be described in more detail. FIG. 2(a) is an image showing a cross-section of a stack including the base member 20, the primer layer 22 and the first hard coating layer 32 and a surface of the first hard coating layer 32. FIG. 2(b) is an image showing a cross-section of a structure where the primer layer 22 is formed on the base member 20 and a surface of the primer layer 22. As shown in FIG. 2(a), the surface of the first hard coating layer 32 (after formation of the first hard coating layer 32) is smooth and even. On the other hand, as shown in FIG. 2(b), the primer layer 22 has a rough surface provided with uneven irregularities. That is, when the first hard coating layer 32 is formed in this embodiment, surface planarization may be provided.

The first hard coating layer 32 may include a variety of materials capable of increasing hardness and improving coating properties of the conductive layer 40. For example, the first hard coating layer 32 may include at least one of a urethane resin, a melamine resin, an alkyd resin, an epoxy resin, an acrylic resin, a polyester resin, a polyvinyl alcohol resin, a vinyl chloride resin, a vinylidene chloride resin, a polyarylate resin, a sulfone resin, an amide resin, an imide resin, a polyethersulfone resin, a polyetherimide resin, a polycarbonate resin, a silicone resin, a fluoride resin, a polyolefin resin, a styrene resin, a vinyl pyrrolidone resin, a cellulose resin and an acrylonitrile resin. In particular, the first hard coating layer 32 may include an acrylic resin, although embodiments are not limited thereto, and the first hard coating layer 32 may include a variety of materials, in addition to the above-described materials.

The first hard coating layer 32 may have a pencil hardness of 1H to 5H. When the pencil hardness of the first hard coating layer 32 is less than 1H, the effect described above may not be sufficiently obtained. Additionally, it may be difficult to produce the first hard coating layer 32 having a pencil hardness exceeding 5H. Additionally, the first hard coating layer 32 may have a contact angle to water of 40 degrees to 60 degrees and a surface tension of 20 dyne/cm to 50 dyne/cm. The contact angle and surface tension of the first hard coating layer 32 may be less than those of the other layer (e.g. primer layer 22). For this reason, when the conductive layer 40 is formed on the first hard coating layer 32, the conductive layer 40 may be easily formed.

A stack including the base member 20, the primer layer 22 and the first and second hard coating layers 32 and 34 may have a haze of 0.1% to 0.4%. For reference, a stack including the base member 20, the primer layer 22 and the second hard coating layer 34 may have a haze exceeding 0.5%. In an example embodiment, the haze may be further decreased to 0.1% to 0.5% by further forming the first hard coating layer 32.

The first hard coating layer 32 may have a thickness that increases hardness of the conductive film 10 and enables planarization of the surface thereof. For this purpose, the first hard coating layer 32 may have a thickness greater than a thickness of the primer layer 22, the conductive layer 40 and the over-coating layer 50. However, when the thickness of the first hard coating layer 32 is excessively large, the thickness of the conductive film 10 may be unnecessarily increased. Accordingly, the thickness of the first hard coating layer 32 may be less than the thickness of the base member 20.

The thickness of the first hard coating layer 32 may be 1 μm to 10 μm. When the thickness of the first hard coating layer 32 is less than 1 μm, it may be difficult to sufficiently obtain the effect of the first hard coating layer 32 described above. When the thickness exceeds 10 μm, the cost associated with the materials may increase and thinness be difficult. When sufficiently taking into consideration effects of the first hard coating layer 32, thinness and/or the like, the thickness of the first hard coating layer 32 may be 3 μm to 5 μm, although embodiments are not limited thereto, and the thickness of the first hard coating layer 32 may be changed.

Figure 4:
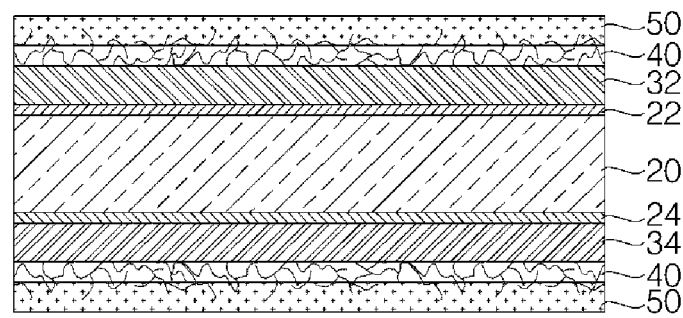
FIG. 4 is a sectional view illustrating a conductive film according to another modified example embodiment.

Meanwhile, the second hard coating layer 34 may be further provided on the lower surface of the base member 20. The second hard coating layer 34 may function to protect the conductive film 10 against damage (e.g. scratches) that may be generated during a process. In the example embodiment, because the conductive layer 40 is not formed on the second hard coating layer 34, the second hard coating layer 34 may simply function to prevent damage to the base member 20 and/or the like. Accordingly, the second hard coating layer 34 may be formed such that the second hard coating layer 34 contacts the base member 20 without additionally interposing a primer layer therebetween because the second hard coating layer 34 does not strictly require adhesion to the base member 20, as compared to the first hard coating layer 32, although embodiments are not limited thereto. Adhesion of the second hard coating layer 34 to the base member 20 can be improved by providing an additional primer layer between the second hard coating layer 34 and the base member 20. Alternatively, as shown in FIG. 4, when the conductive layer 40 and the over-coating layer 50 are formed on both surfaces of the base member 20, an additional primer layer 24 may be provided between the base member 20 and the second hard coating layer 34. Characteristics, materials, thicknesses and/or the like of the primer layer 24, the conductive layer 40 and the over-coating layer 50 provided on the lower surface of the base member 20 are the same as or similar to those of the primer layer 22, the conductive layer 40 and the over-coating layer 50 disposed on the upper surface of the base member 20. Accordingly, details of these layers may be omitted.

With reference to FIG. 1, various properties, such as material, thickness and/or the like, of the second hard coating layer 34 may be the same as or extremely similar to those of the first hard coating layer 32 and details thereof may be omitted. The conductive film 10 may have a pencil hardness of 2H or more (e.g. 2H to 10H) because the conductive film 10 may be provided with the first and second hard coating layers 32 and 34.

In an example embodiment, among the second hard coating layer 34, the base member 20, the primer layer 22, the first hard coating layer 32, the conductive layer 40 and the over-coating layer 50, adjacent layers may contact one another, thus maximizing simplification of an overall structure, although embodiments are not limited thereto, and an additional layer may be further provided between the adjacent layers.

The conductive film 10 may include the first hard coating layer 32 formed between the conductive layer 40 (including conductors 42 composed of a nano-material having a network structure) and the base member 20. As a result, hardness of the conductive film 10 may be improved and damage to the conductive layer 40 or change of properties thereof may thus be prevented during the process. Additionally, the surface on which the conductive layer 40 is formed may be planarized so that coating properties of the conductive layer 40 are improved and scattered reflection may be reduced.

The conductive film 10 as described above may be applied to a variety of electronic devices after patterning the conductive layer 40. A method of forming a conductive film 110 (or conductive film 10) having a patterned conductive layer 40 by forming the conductive film 10 and then patterning the conductive layer 40 may be described with reference to FIGS. 5A to 5F.

FIGS. 5A to 5F are sectional views illustrating a method for manufacturing a conductive film according to an example embodiment. Other embodiments and configurations may also be provided.

Figure 5A:
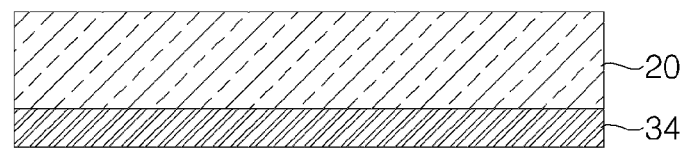
FIGS. 5A to 5F are sectional views illustrating a method for manufacturing a conductive film according to an example embodiment.

FIG. 5A shows the base member 20 is prepared and the second hard coating layer 34 is formed thereon. The second hard coating layer 34 may be formed on the base member 20 by coating with a paste including a curable resin using a variety of methods such as bar coating, gravure coating and/or reverse coating. As a result, generation of damage to the base member 20 and/or the like during a subsequent process may be prevented. A variety of methods may be used as the formation method of the first hard coating layer 34, although embodiments are not limited thereto.

Figure 5B:
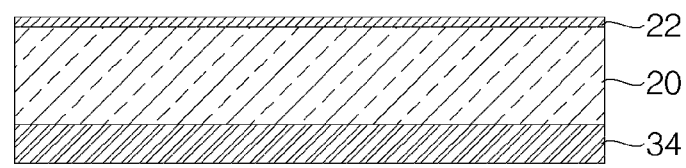

FIG. 5B shows the primer layer 22 is formed on the base member 20. The primer layer 22 may be formed on the base member 20 by coating the base member 20 with a paste including a curable resin using a variety of methods such as bar coating, gravure coating and/or reverse coating. A variety of methods may be used as the formation method of the primer layer 22, although embodiments are not limited thereto.

Figure 5C:
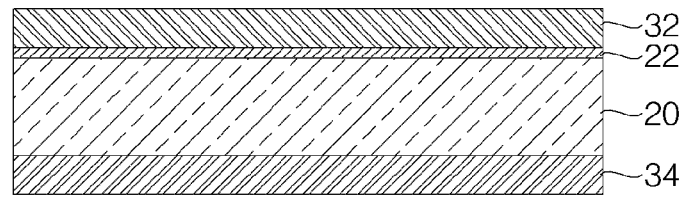

FIG. 5C shows the first hard coating layer 32 is formed on the primer layer 22. The first hard coating layer 32 may be formed on the primer layer 22 by roll-to-roll coating, bar coating, gravure coating, reverse coating and/or the like. A variety of methods may be used as the formation method of the first hard coating layer 32, although embodiments are not limited thereto.

Figure 5D:
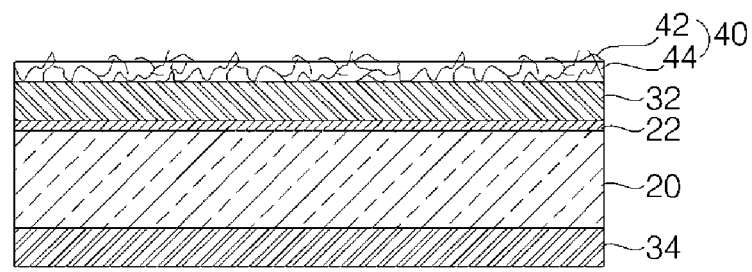

As shown in FIG. 5D, the conductive layer 40 is formed on the first hard coating layer 32. For example, in the example embodiment, the conductive layer 40 may be produced by wet coating including coating with a paste or an ink containing silver nanowires and/or the like. As a result, a manufacturing process may be further simplified. After the wet coating of the paste or the ink containing silver nanowires and/or the like, the conductive layer 40 may be dried and may be calendared by pressing at a predetermined pressure to improve adhesivity of the conductive layer 40.

Figure 5E:
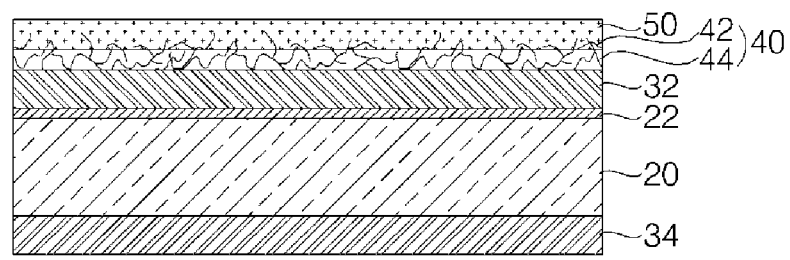

As shown in FIG. 5E, the over-coating layer 50 may be formed on the conductive layer 40. In the example embodiment, the over-coating layer 50 may be formed by coating a photosensitive resin and then curing the same. Through this method, the manufacturing process may be further simplified. The over-coating layer 50 may be formed under a nitrogen purge atmosphere in order to prevent oxidation of the conductive layer 40 (containing silver nano-wires) and secure durability. As a result, the conductive film 10 may be manufactured.

Figure 5F:
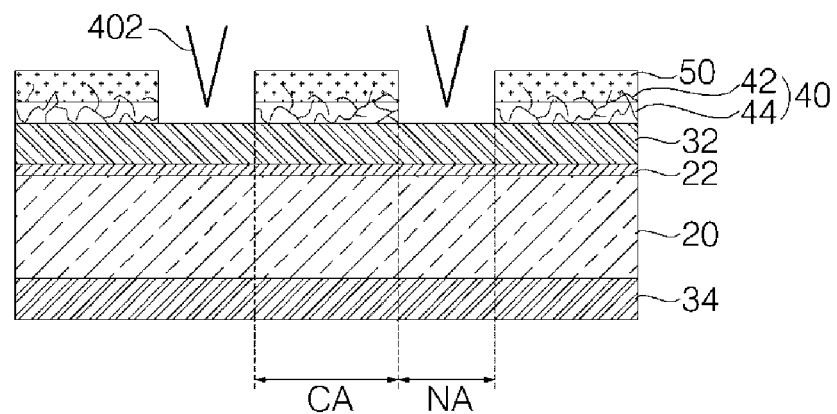

FIG. 5F shows a conductive region (CA) and a non-conductive region (NA). The conductive region may also be called a conductive area, the non-conductive region may be called a non-conductive area.

Figure 6:
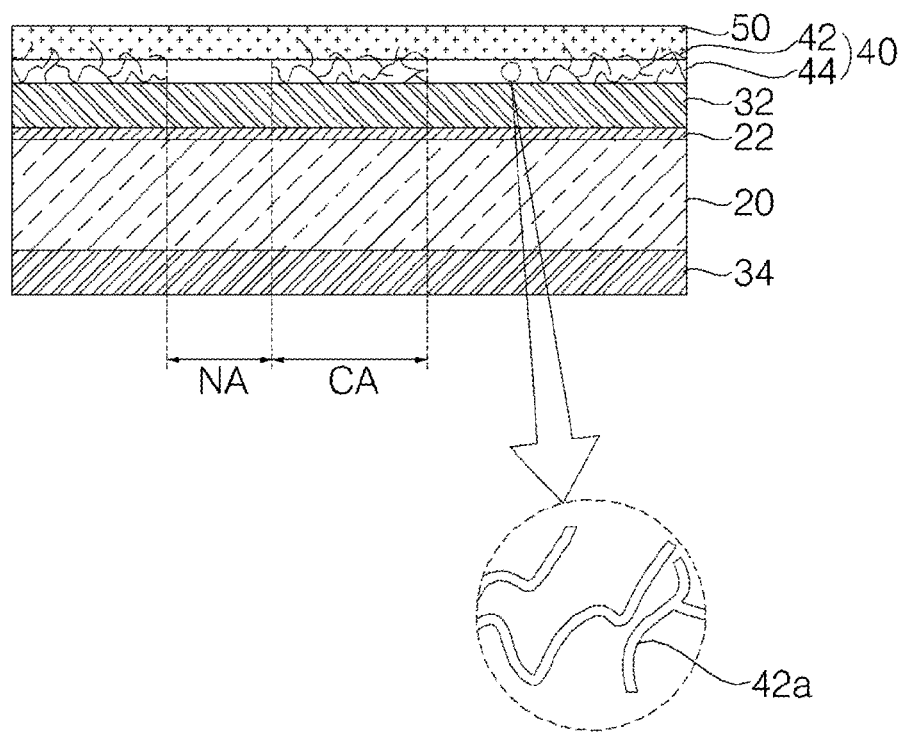
FIG. 6 is a sectional view illustrating a patterned conductive film according to another modified example embodiment.

As shown in FIG. 5F, the conductors 42 may be removed from a part corresponding to the non-conductive region (NA) by irradiation with a laser 402. As shown in FIG. 5F, the conductive layer 40 (including the conductors 42) and the over-coating layer 50 may be simultaneously removed by the laser 402, although embodiments are not limited thereto. FIG. 6 shows a void 42a of the network structure may be formed in a portion of the conductive layer 40 in which the conductors 42 are disposed by removing only the conductors 42 from the part corresponding to the non-conductive region (NA) by the laser 402. That is, as shown in FIG. 6, only the conductors 42 may be selectively removed by controlling the type, the power and/or the like of the laser. As shown in FIG. 5F, both the conductive layer 40 (including the conductors 42) and the over-coating layer 50 may be removed.

The laser 402 may be a laser having a linear beam, although embodiments are not limited thereto, and various lasers may be used.

The conductive layer 40 may be patterned by a simple process because the conductive layer 40 is patterned using the laser 402. That is, the conductive layer 40 may be easily patterned by irradiation to the conductive layer 40 with the laser in accordance with a predetermined passage. On the other hand, use of a photolithographic process involves a series of processes including formation of a resist, exposure, developing, etching and/or removal of the resist, thus making the overall process complicated and causing deterioration in production efficiency.

Through such patterning, the conductive film 110 including a conductive layer 40 having electrical conductivity only in the conductive region (CA) may be formed, although embodiments are not limited thereto, and the conductors 42 of the non-conductive region (NA) may be removed by wet etching and/or the like. That is, when an etching solution or paste is supplied to the non-conductive region (NA), the etching material may permeate into the over-coating layer 50 and the conductive layer 40 and may remove the conductors 42. For example, resins constituting the over-coating layer 50 may have a cross-linking degree of less than 100% (e.g. 90% or less), thus allowing the etching solution or paste to naturally permeate into the over-coating layer 50 and/or the like.

The resin constituting the over-coating layer 50 and the conductive layer 40 is not etched and only the nano-wires and/or the like may be selectively etched. A photolithographic process may be used as a method for disposing the etching solution, paste and the like in the non-conductive region (NA), although embodiments are not limited thereto, and a variety of methods may be used. Nitric acid, hydrochloric acid, sulfuric acid, a mixture thereof (for example, aqua regia) and/or the like may be used as a wet solution for selectively etching the conductors 42. The etching may be carried out at a temperature (e.g. 30° C. to 90° C.) higher than room temperature for one minute to 24 hours.

An example of an electronic device employing the conductive film having the patterned conductive layer as described above may now be described.

Figure 7:
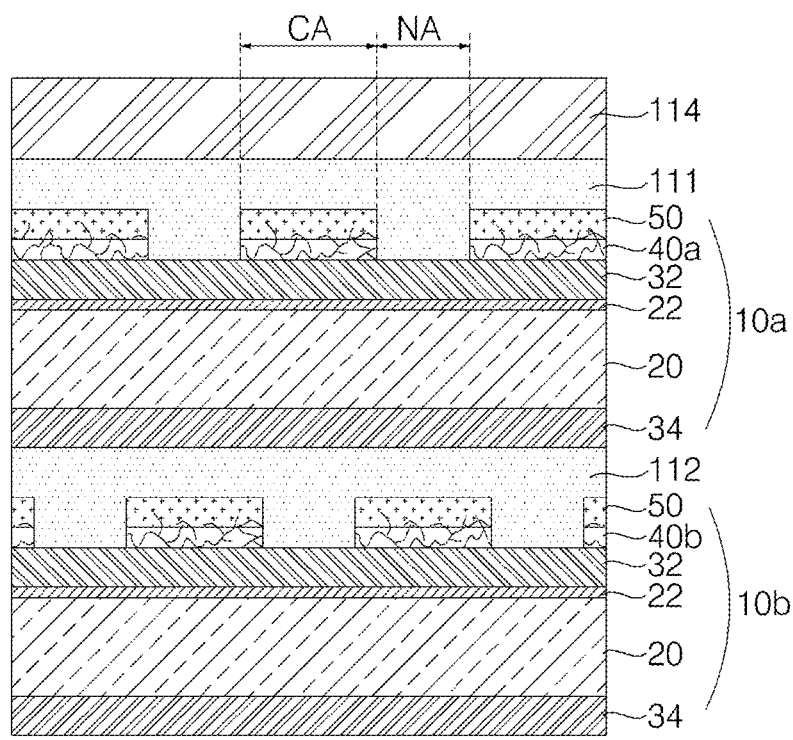
FIG. 7 is a sectional view illustrating a touch panel according to an example embodiment.
Figure 8:
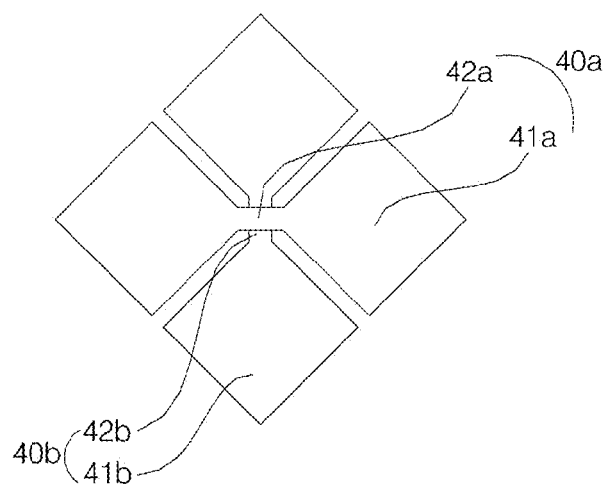
FIG. 8 is a plan view schematically illustrating plane shapes of first and second conductive layers constituting first and second electrodes, respectively, in the touch panel according to the example embodiment.

FIG. 7 is a sectional view illustrating a touch panel according to an example embodiment. FIG. 8 is a plan view illustrating plane shapes of first and second conductive layers constituting first and second electrodes, respectively, in the touch panel according to the example embodiment. Other embodiments and configurations may also be provided.

FIGS. 7 and 8 shows a touch panel 100 that may include a first conductive film 10a, a first transparent adhesion layer 111, a second conductive film 10b, a second transparent adhesion layer 112 and a cover substrate 114. The touch panel 100 may include a first conductive layer 40a (constituting a first electrode) and a second conductive layer 40b (constituting a second electrode), which is provided to be insulated with the first conductive layer 40a. At least one of the first and second conductive layers 40a and 40b may include a nano-material forming a network structure, as described above.

More specifically, the touch panel 100 may include the cover substrate 114, the first conductive film 10a provided with the first conductive layer 40a, the second conductive film 10b provided with the second conductive layer 40b, the first transparent adhesion layer 111 interposed between the cover substrate 114 and the first conductive film 10a, and the second transparent adhesion layer 112 interposed between the first conductive film 10a and the second conductive film 10b.

The conductive layer 40a (of the first conductive film 10a) may include the first electrode disposed in one direction, and the conductive layer 40b (of the second conductive film 10b) may include the second electrode disposed in a direction crossing the first electrode. As shown in FIG. 8, the conductive layer 40a (including the first electrode) may include a plurality of first sensors 41a to sense touch of an input tool (such as a finger) and at least one first connector 42a to connect the first sensors 41a. The first connector 42a connects the first sensors 41a in one direction. The conductive layer 42b (including the second electrode) may include a plurality of second sensors 41b to sense contact of an input tool (such as a finger), and at least one second connector 42b to connect the second sensors 41b. The second connector 42b may connect the second sensors 41b in a direction crossing the first electrode.

As shown, the first sensors 41a may individually have a diamond shape and the second sensors 41b may individually have a diamond shape, although embodiments are not limited thereto. Accordingly, the first and second sensors 41a and 41b may have a variety of shapes such as a polygon, for example, a triangle or square, and/or a circle or oval.

The first and second conductive films 10a and 10b of the touch panel 100 may correspond to the conductive film 110 (or conductive film 10) described with reference to FIGS. 1 to 6. Additionally, the first and/or second conductive layers 40a and 40b of the first and second conductive films 10a and 10b may correspond to the conductive layer 40 described with reference to FIGS. 1 to 6. The conductive film 110 (or conductive film 10) may be applied to the first and second conductive films 10a and 10b, and the first and second conductive films 10a and 10b may have the same structure, material and/or the like, although embodiments are not limited thereto. Accordingly, only one of the first and second conductive films 10a and 10b may have the same structure and material as the conductive film 110 (or conductive film 10) and the other one of the first and second conductive films 10a and 10b may have different structure and material from the conductive film 110 (or conductive film 10). Additionally, at least one of the first and second conductive films 10a and 10b may be composed of a conductor of a nano-material forming a network structure and may have a stack structure different from that of the conductive film 110 (or conductive film 10) described with reference to FIGS. 1 to 6. Various other modifications may also be provided.

In the example embodiment, the first and/or second conductive films 10a and 10b including the first and/or second conductive layers 40a and 40b (including the conductor of the nano-material) may be used for the touch panel 100. The conductive films 10a and 10b may have superior properties to indium-tin oxide (ITO) previously used for the touch panel. This may be described in more detail.

The conductive layer (of the conductive film 10) may be formed to have a resistance of 10 $\Omega/m^2$ to 150 $\Omega/m^2$. When the previous indium-tin oxide is used, formation of a conductive layer having a resistance of 200 $\Omega/m^2$ or less (and more particularly, 150 $\Omega/m^2$ or less) is difficult due to low resistance of the indium-tin oxide or formation of the conductive layer having an excessively greater thickness is inevitable. On the other hand, formation of the conductive layer having a low resistance of 150 $\Omega/m^2$ or less to a small thickness is possible using superior electrical properties of the conductors 42 having a network structure, including nanowires and/or the like.

Figure 9:
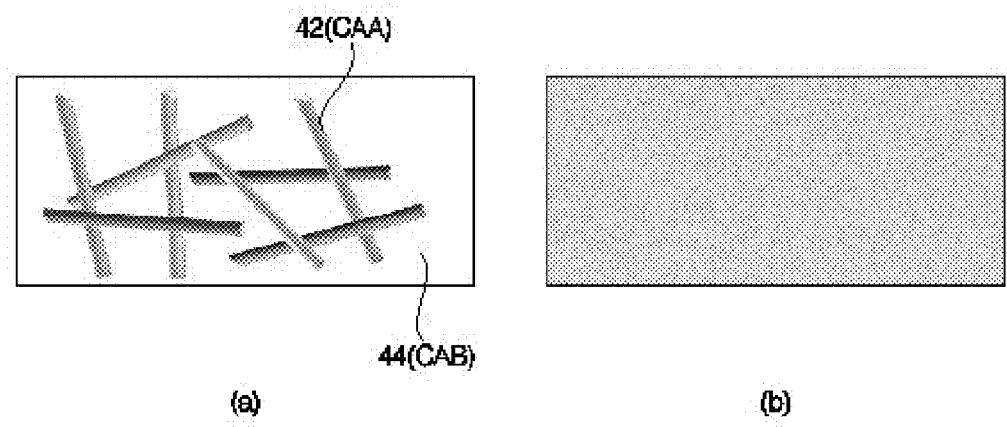
FIG. 9 illustrates a plane structure in a conductive region of the conductive layer applied to the touch panel according to the example embodiment as shown on the left side with label (a) and a plane structure in a conductive region of the conductive layer formed by depositing indium-tin oxide as shown on the right side with label (b)
Figure 10:
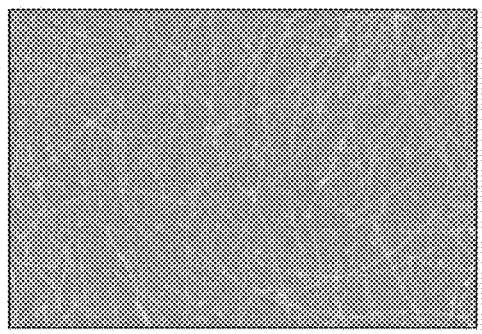
FIG. 10 shows images showing a plane of the conductive layer produced in accordance with a production example on the left side with label (a) and a plane of a conductive layer formed by depositing indium-tin oxide on the right side with label (b)
Figure 10:
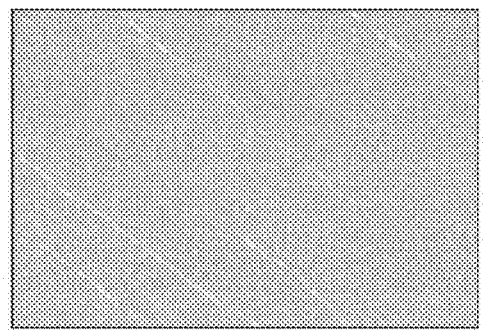

The conductive layer in the conductive region (CA) includes the conductors 42 having a network structure and has a plane shape different from that of the conductive layer using indium-tin oxide and/or the like. This may be described with reference to FIGS. 9 and 10.

FIG. 9(a) illustrates a plane structure in a conductive region of the conductive layer applied to the touch panel according to an example embodiment. FIG. 9(b) illustrates a plane structure in a conductive region of the conductive layer formed by depositing indium-tin oxide. FIG. 10(a) is an image showing a plane of the conductive layer produced in accordance with a production example. FIG. 10(b) is an image showing a plane of the conductive layer formed by depositing indium-tin oxide. Other embodiments and configurations may also be provided.

FIG. 9(a) shows a conductive region (CA) of the conductive layer that includes a conductive portion (CAA) in which the conductors 42 are provided and a non-conductive portion (CAB) in which the conductors 42 are not provided and only a residual portion 44 is provided or both of the conductors 42 and the residual portion 44 are not provided. Because the conductors 42 have a network structure, the conductive region (CA) may also include the non-conductive portion (CAB). When the conductive region (CA) includes the non-conductive portion (CAB) as described above, the non-conductive portion (CAB) may allow for transmission of light and the conductive layer may thus have superior transmittance. Additionally, excellent electrical connection between adjacent conductors 42 may be maintained via contact points (CP), or intersection points) therebetween.

For example, a ratio of an area of the conductive portion (CAA) to a total area of the conductive layer may be 0.05 to 0.95. When the ratio is less than 0.05, the conductive portion (CAA) may become narrow and it may be difficult to implement the desired low resistance. When the ratio exceeds 0.95, cost burden may be generated due to increased amount of the conductors 42.

As shown in FIG. 9(b), in the conductive layer formed using indium-tin oxide or the like, indium-tin oxide may be coated in 100% of the conductive region. A region in which indium-tin oxide is not coated may not function as a conductive region. Deterioration in transmittance caused by indium-tin oxide may be generated because indium-tin oxide should be coated over the entire surface of the conductive region.

The difference described above may be more accurately understood by comparison between actual images of FIGS. 10(a) and 10(b). In the production example, the conductors 42 having a network structure may be provided and a region in which the conductors 42 are not provided may also be provided. On the other hand, in FIG. 10(b), indium-tin oxide may be entirely formed in the conductive layer formed using indium-tin oxide. For reference, lines shown in FIG. 10(b) may correspond to cracks generated due to stress difference and/or the like.

The conductive layer may control resistance of the conductive layer according to thickness, amount of the conductor 42 and/or the like. That is, as the thickness of the conductive layer increases, as the amount of the conductor 42 in the conductive layer increases, and/or as the number of contact points (CP) of the conductor 42 in the conductive layer increases, resistance of the conductive layer 40 may decrease. This may be described in more detail with reference to FIGS. 11 to 13.

Figure 11:
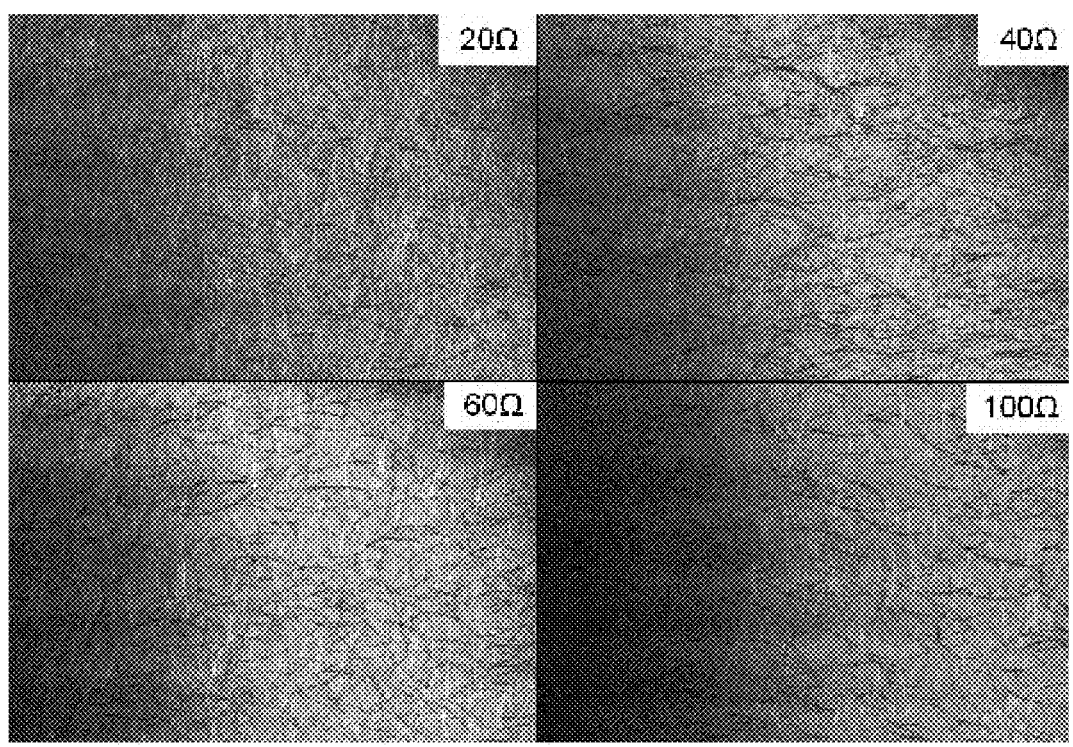
FIG. 11 are images showing a cross-section of the conductive layer produced in accordance with a production example of the present invention under resistance conditions of 20 Ω/m$^2$, 40 Ω/m$^2$, 60 Ω/m$^2$ and 100 Ω/m$^2$.
Figure 12:
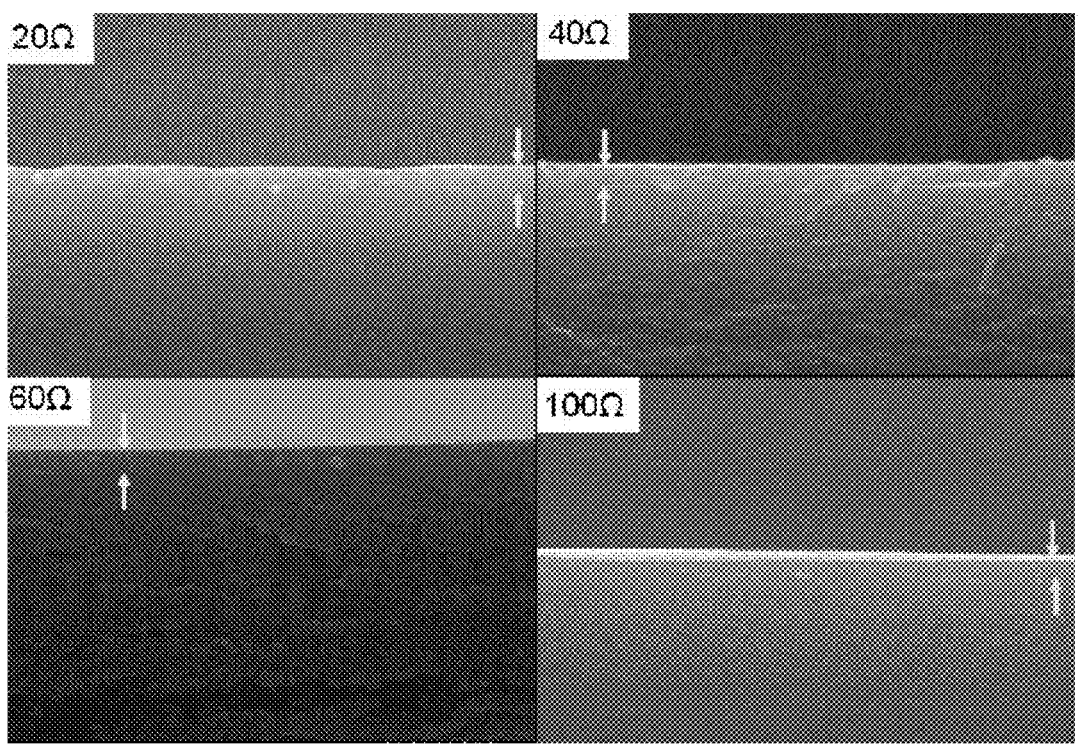
FIG. 12 are images showing a plane of the conductive layer produced in accordance with the production example under resistance conditions of 20 Ω/m$^2$, 40 Ω/m$^2$, 60 Ω/m$^2$ and 100 Ω/m$^2$.
Figure 13:
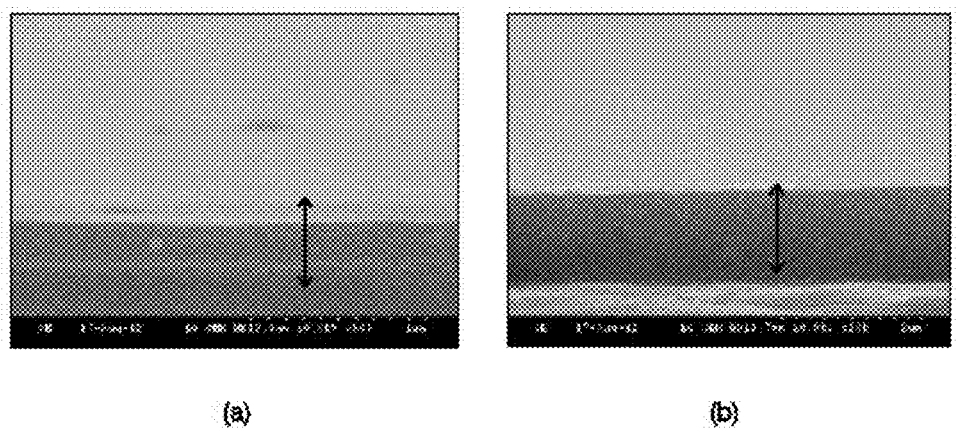
FIG. 13 shows images showing a plane of the conductive layer produced in accordance with an example embodiment on the left side with label (a) and a plane of a conductive layer formed using indium-tin oxide on the right side with label (b)

FIG. 11 are images showing a cross-section of the conductive layer produced in accordance with a production example under resistance conditions of 20 $\Omega/m^2$, 40 $\Omega/m^2$, 60 $\Omega/m^2$ and 100 $\Omega/m^2$. FIG. 12 are images showing a plane of the conductive layer produced in accordance with the production example under resistance conditions of 20 $\Omega/m^2$, 40 $\Omega/m^2$, 60 $\Omega/m^2$ and 100 $\Omega/m^2$. FIG. 13(a) is an image showing a plane of the conductive layer produced in accordance with an example embodiment. FIG. 13(b) is an image showing a plane of the conductive layer formed using indium-tin oxide.

As an amount (or number) of the conductors in the conductive layer 40 (i.e., ratio or coverage) of a conductive portion (CAA) to a total area of the conductive layer increases or contact points (CP) of the conductor 42 increase in number, the resistance of the conductive layer decreases. Referring to FIG. 11, as compared to a conductive layer having a resistance of 100 $\Omega/m^2$, the conductive layer having a resistance of 60 $\Omega/m^2$ has a greater amount of the conductors 42 and more contact points (CP) of the conductors 42. That is, in an order of 100 $\Omega/m^2$ to 60 $\Omega/m^2$, 40 $\Omega/m^2$ and 20 $\Omega/m^2$, the formed conductors 42 may increase in number and thus become more dense.

For example, when the resistance of the conductive layer is 10 $\Omega/m^2$ to 150 $\Omega/m^2$, the total number of the conductors 42 is 20 or more and the total number of the contact points (CP) formed by contact between the conductors 42 is 5 or more in a unit area having a width of 10 μm and a length of 10 μm, when seen in plan view. When the total number of the conductors 42 is less than 20 or the total number of the contact points (CP) is less than 5, then the resistance of the conductive layer cannot be obtained to a desired level. The total number of the conductors 42 and the total number of the contact points (CP) are not particularly limited, an upper limit of the number of the conductors 42 is, for example, 1,000 and an upper limit of the number of the contact points (CP) is 10,000. When the total number of the conductors and the total number of the contact points (CP) exceed the upper limits, it may be substantially difficult to manufacture the conductive layer or the cost may increase due to increased amount of the conductors 42, although embodiments are not limited thereto.

When the thickness of the conductive layer increases, the amount (or total number) of the conductors 42 contained in the conductive layer increases and resistance of the conductive layer decreases. Referring to FIGS. 12(a) to 12(d) obtained at the same scale, as compared to the example in which a resistance is 100 $\Omega/m^2$, the thickness (distance between two arrows) of the conductive layer is relatively larger in the case in which the resistance is 60 $\Omega/m^2$. That is, the conductive layer increases in thickness in an order of 100 $\Omega/m^2$ to 60 $\Omega/m^2$, 40 $\Omega/m^2$ and 20 $\Omega/m^2$.

For example, when the resistance of the conductive layer is 10 $\Omega/m^2$ to 150 $\Omega/m^2$, the thickness of the conductive layer may be 50 nm to 350 nm. The thickness of the conductive layer may be a thickness formed by the conductor 42 forming a network structure. This thickness may be a thickness of the conductive layer including the conductors having a network structure that is optimized so that the conductive layer has a resistance of 150 $\Omega/m^2$ or less (and more specifically 10 $\Omega/m^2$ to 150 $\Omega/m^2$). When the thickness of the conductive layer 40 is less than 50 nm, it may be difficult to obtain the desired resistance. When the thickness of the conductive layer is 350 nm or more, the thickness of the conductive layer may be unnecessarily increased. This thickness may be much less than the thickness of the conductive layer formed using indium-tin oxide.

As a production example, in the example in which the conductive layer having the same resistance of 100 $\Omega/m^2$ is formed, the conductive layer of the production example may have a small thickness of 200 nm, as shown in FIG. 13(a), while the conductive layer formed using indium-tin oxide may have a great thickness exceeding 1 μm, as shown in FIG. 13(b). That is, in the present example, the conductive layer having a constant resistance may be formed to an extremely small thickness.

As a result, a ratio of the thickness of the conductive layer to the thickness of the first and/or second transparent adhesion layers 111 and 112 of the touch panel 100 may be small as compared to a previous case. That is, the ratio of the thickness of the conductive layer to the thickness of the first and/or second transparent adhesion layers 111 and/or 112 may be 0.00033 to 0.014. When the thickness ratio is less than 0.00033, the desired resistance may not be obtained due to small thickness of the conductive layer. When the ratio of the thickness exceeds 0.014, the thickness of the first or second transparent adhesion layers 111 and 112 decreases and sufficient implementation of the function thereof may be difficult, although embodiments are not limited to the thickness ratio.

The conductive layer including the conductors 42 having a nano-material (having a network structure)may be used as the first conductive layer 40a and/or the second conductive layer 40b for the touch panel 100. As a result, the conductive layer includes a non-conductive portion (CAB), thereby improving transmittance, reducing cost due to decrease in amount of raw materials used for the conductors 42 and obtaining low resistance due to superior electrical properties of the conductors 42. Accordingly, the touch panel 100 includes the conductive layer which has a lower resistance and a smaller thickness than a previously example and is thus implemented in a wide area and exhibits superior optical properties and/or the like. For example, the touch panel 100 may have a transmittance of 80% or more (more specifically greater than 90% or at a maximum of 95% or more) and a haze of 3% or less (more specifically less than 1% or at a maximum 0.2% or less).

The first conductive film 10a and the second conductive film 10b may be fixed to each other via the first transparent adhesion layer 111. Additionally, the first and second conductive films 10a and 10b may be protected from external shock by fixing the cover substrate 114 on the second conductive film 10b using the second transparent adhesion layer 112.

The first transparent adhesion layer 111 may include a variety of materials that enable bonding between the cover substrate 114 and the first conductive film 10a. The second transparent adhesion layer 112 may include a variety of materials that enable bonding between the first conductive film 10a and the second conductive film 10b.

The first and second transparent adhesion layers 111 and 112 may have a thickness of 25 µm to 150 µm. When the thickness is less than 25 µm, adhesivity may not be sufficient, maintenance of insulation may be difficult, and implementation of a process such as a lamination process may be difficult. When the thickness exceeds 150 µm, (i.e., the thickness is great), then the thickness of the touch panel 100 increases and optical properties such as transmittance are deteriorated, although embodiments are not limited thereto, and the thickness of the first and second transparent adhesion layers 111 and 112 may be changed.

When an input tool (such as a finger) touches the touch panel 100, difference in capacitance may be generated in a portion of the touch panel 100 that the input tool touches and the portion may be detected as a touch position.

Figure 14:
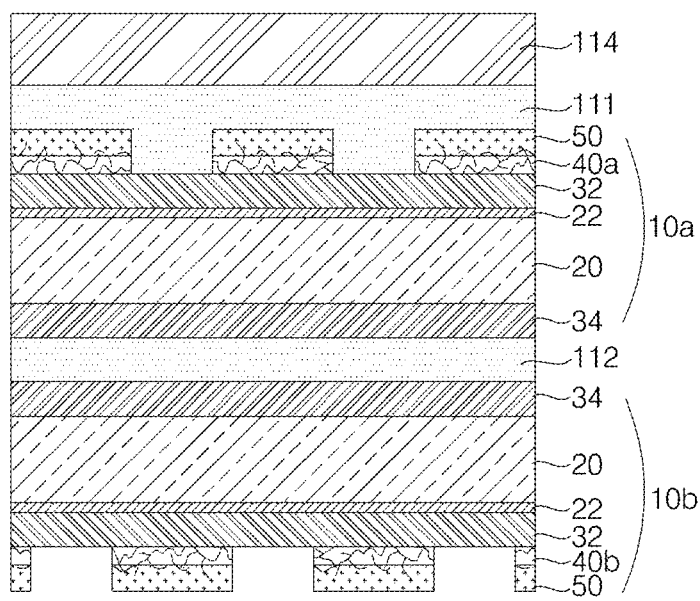
FIG. 14 is a sectional view illustrating a touch panel according to another example embodiment.

FIG. 14 is a sectional view illustrating a touch panel according to another example embodiment. Other embodiments and configurations may also be provided.

FIG. 14 shows the touch panel 100 includes the first conductive film 10a provided with the first conductive layer 40a, the first transparent adhesion layer 111, the second conductive film 10b provided with the second conductive layer 40b, the second transparent adhesion layer 112 and the cover substrate 114. In a previous embodiment, the first and second conductive layers 40a and 40b of the first and second conductive films 10a and 10b are disposed close to the cover substrate 114 based on the base member 20. In the present embodiment, the first conductive layer 40a is provided opposite to the cover substrate 114 based on the base member 20 of the first conductive film 10a, and the second conductive layer 40b is provided close to the cover substrate 114, based on the base member 20 of the second conductive film 10b. The position (or the like) of the first and second conductive layers 40a and 40b may be variably changed.

Figure 15:
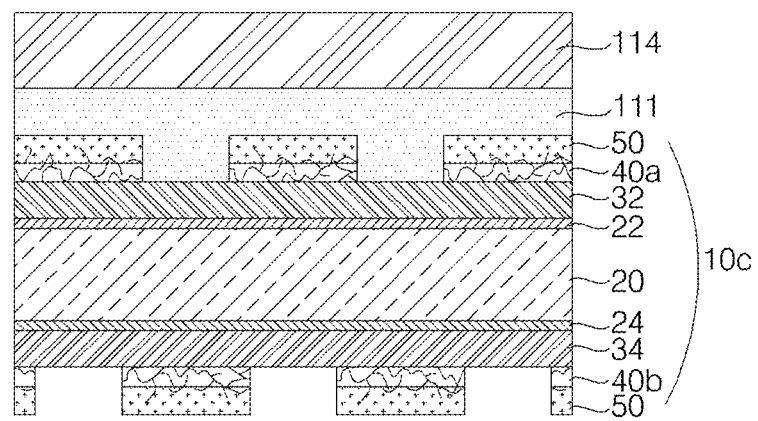
FIG. 15 is a sectional view illustrating a touch panel according to another example embodiment.

FIG. 15 is a sectional view illustrating a touch panel according to another example embodiment. Other embodiments and configurations may also be provided.

FIG. 15 shows that the touch panel 100 includes a conductive film 10c provided on both surfaces thereof with a first conductive layer 40a and a second conductive layer 40b, a transparent adhesion layer 111 and a cover substrate 114. In this example, the first hard coating layer 32, the first conductive layer 40a, the over-coating layer 50 and the primer layer 22 are provided on a first surface of the conductive film 10c and the another primer layer 24, the second hard coating layer 34, the second conductive layer 40b and the over-coating layer 50b are provided on a second surface of the conductive film 10c. However, the primer layers 22 and 24, the first and second hard coating layers 32 and 34 and the like are not indispensible elements and may be removed. An additional layer (e.g. a protective layer or the like) covering the second conductive layer 40b and the over-coating layer 50 formed on the lower surface of the second conductive layer 40b may be further provided. Other various modifications may also be provided.

The first conductive layer 40a and the second conductive layer 40b provided on different surfaces of the conductive film 10c may constitute the first and second electrodes. Based on such a structure, the structure of the touch panel 100 may be simplified, the total number of the base members 20 having the greatest thickness may be reduced and thinness of the touch panel 100 may thus be possible.

Figure 16:
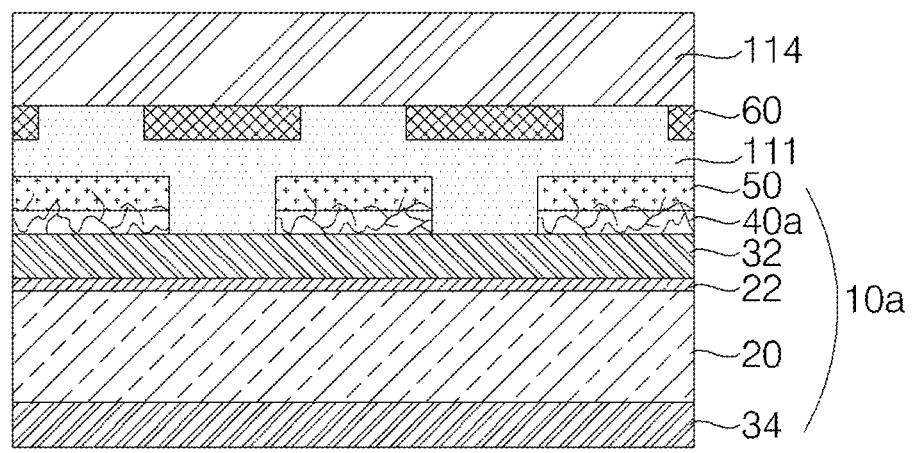
FIG. 16 is a sectional view illustrating a touch panel according to another example embodiment.

FIG. 16 is a sectional view illustrating a touch panel according to another example embodiment. Other embodiments and configurations may also be provided.

FIG. 16 shows the touch panel 100 includes the first conductive film 10a provided with the first conductive layer 40a, the transparent adhesion layer 112, and the cover substrate 114 provided with a transparent conductive material layer 60. The transparent conductive material layer 60 may be a second conductive layer, which is composed of a transparent conductive material different from that of the first conductive layer 40a. The transparent conductive material layer 60 may be formed of a material (e.g. indium-tin oxide) that can be easily formed on the cover substrate 114 (such as glass). The first conductive layer 40a and the transparent conductive material layer 60 may constitute the first and second electrodes, respectively.

A difference in resistance between the first conductive layer 40a and the transparent conductive material layer 60 caused by the difference in material therebetween may be removed by controlling thickness or the like of the first conductive layer 40a and the transparent conductive material layer 60. Alternatively, in the example in which a difference between a width and a length of the touch panel 100 is present, an electrode in which the first conductive layer 40a having a relatively low resistance may be provided in a long axis and an electrode in which a transparent conductive material layer 60 having a relatively high resistance may be provided in a short axis. Various other modifications may also be provided.

The thickness of the touch panel 100 may be minimized by forming the transparent conductive material layer 60 on the cover substrate 114, and electrical properties of the touch panel 100 may be improved using low resistance of the first conductive layer 40a and/or the like.

The touch panel may be an example of an electronic device including the conductive film in the description provided above, although embodiments are not limited thereto. Accordingly, the conductive film may be applied to a variety of electronic devices.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A conductive film comprising:
    a base member;
    a first hard coating layer on a first surface of the base member;
    a conductive layer directly on the first hard coating layer,
    the conductive layer includes a plurality of nano-wires to form a network structure;
    and an over-coating layer on the conductive layer to cover the nano-wires of the conductive layer, wherein some of the plurality of nano-wires are protruding from an inner region of the conductive layer and are inserted into an inner region of the over-coating layer,
    wherein the conductive film includes a conductive region and a non-conductive region,
    and the non-conductive region includes a residual portion having a void based on removal of only the nano-wires in the conductive layer.

2. The conductive film according to claim 1, wherein the conductive layer includes the residual portion surrounding the nano-wires.

3. The conductive film according to claim 2, wherein nano-wires have a thickness greater than the residual portion and extending or protruding to outside of the residual portion, and
    the over-coating layer covers the conductors extending to the outside of the residual portion.

4. The conductive film according to claim 1, further comprising at least one of a second hard coating layer on a second surface of the base member.

5. The conductive film according to claim 1, further comprising a primer layer between the base member and the first hard coating layer.

6. The conductive film according to claim 1, wherein the first hard coating layer includes an acrylic material.

7. The conductive film according to claim 1, wherein a thickness of the first hard coating layer is less than a thickness of the base member, and the thickness of the first hard coating layer is greater than a thickness of the conductive layer.

8. The conductive film according to claim 1, wherein the conductive film is provided such that the conductive region includes the conductive layer and the over-coating layer, and the non-conductive region is provided without the conductive layer and the over-coating layer.

9. A touch panel comprising:
    a first conductive film comprising a base member,
    a primer layer on a first surface of the base member,
    a first hard coating layer on the primer layer,
    a first conductive layer directly on the first hard coating layer,
    and an over-coating layer on the first conductive layer,
    the first conductive layer includes a plurality of nano-wires to form a network structure,
    and the over-coating layer to cover the nano-wires of the first conductive layer;
    a second conductive layer constituting a second electrode that is different from the first conductive layer;
    and a cover substrate for covering the first conductive film and the second conductive layer,
    wherein the cover substrate being a separate member from the first conductive film, wherein the first conductive layer includes a conductive region,
    and the conductive region of the first conductive layer includes a conductive portion in which the nano-wires are provided and a non-conductive portion in which the nano-wires are not provided,
    wherein some of the plurality of nano-wires are protruding from an inner region of the first conductive layer and are inserted into an inner region of the over-coating layer,
    wherein the first conductive film includes a conductive region and a non-conductive region,
    and the non-conductive region includes a residual portion having a void based on removal of only the nano-wires in the first conductive layer.

10. The touch panel according to claim 9, wherein the first conductive film is provided such that the conductive region includes the first conductive layer and the over-coating layer, and the non-conductive region is provided without the first conductive layer and the over-coating layer.

11. The touch panel according to claim 10, further comprising:
    at least one transparent adhesion layer positioned at the non-conductive region.

12. The touch panel according to claim 9, wherein the first conductive layer includes the residual portion surrounding the nano-wires.

13. The touch panel according to claim 12, wherein nano-wires have a thickness greater than the residual portion and extending or protruding to outside of the residual portion, and
    the over-coating layer covers the nano-wires extending to the outside of the residual portion.

14. The touch panel according to claim 9, further comprising at least one of a second hard coating layer on a second surface of the base member.

15. The touch panel according to claim 9, wherein the first hard coating layer includes an acrylic material.

16. The touch panel according to claim 9, wherein a thickness of the first hard coating layer is less than a thickness of the base member, and the thickness of the first hard coating layer is greater than a thickness of the first conductive layer.

* * * * *